United States Patent [19]
Bergemont et al.

[11] Patent Number: 5,856,222
[45] Date of Patent: Jan. 5, 1999

[54] METHOD OF FABRICATING A HIGH DENSITY EEPROM CELL

[75] Inventors: Albert Bergemont; Min-hwa Chi, both of Palo Alto, Calif.

[73] Assignee: National Semiconductor Corp., Santa Clara, Calif.

[21] Appl. No.: 851,252

[22] Filed: May 5, 1997

[51] Int. Cl.[6] .............................................. H01L 21/8247
[52] U.S. Cl. .......................................... 438/258; 438/263
[58] Field of Search ................................... 438/258, 263, 438/264, 266, 282, 593, 594

[56] References Cited

U.S. PATENT DOCUMENTS

| | | | |
|---|---|---|---|
| 5,057,446 | 10/1991 | Gill et al. | 438/263 |
| 5,379,253 | 1/1995 | Bergemont | 438/263 |
| 5,587,332 | 12/1996 | Chang et al. | 438/258 |
| 5,712,178 | 1/1998 | Cho et al. | 438/258 |

OTHER PUBLICATIONS

E.K. Shelton, "Low–Power EE–PROM Can Be Reprogrammed Fast", Electronics, pp. 89–92, Jul. 31, 1980.

*Primary Examiner*—Chandra Chaudhari
*Attorney, Agent, or Firm*—Limbach & Limbach L.L.P.

[57] ABSTRACT

A method of fabricating an EEPROM cell structure in a semiconductor substrate includes forming a layer of silicon oxide having a first thickness on the silicon substrate. N-type dopant is then introduced into the semiconductor substrate to define a buried region beneath the silicon oxide layer. Next, a tunnel window opening is formed in the silicon oxide layer to expose a surface area of the buried region. A layer of tunnel oxide is then grown in the tunnel window opening on the exposed surface of the buried region, such that the tunnel oxide has a thickness that is less than the thickness of the silicon oxide. A first layer of polysilicon is then formed on the structure resulting from the foregoing steps, followed by an overlaying layer of oxide\nitride\oxide (ONO) and an overlying layer of second polysilicon. The poly-2, ONO\poly-1 sandwich is then anisotropically etched to form first and second stacks which provide the floating gate/control gate electrodes for the EEPROM cell access transistor and the EEPROM cell storage cell structure, respectively.

4 Claims, 8 Drawing Sheets

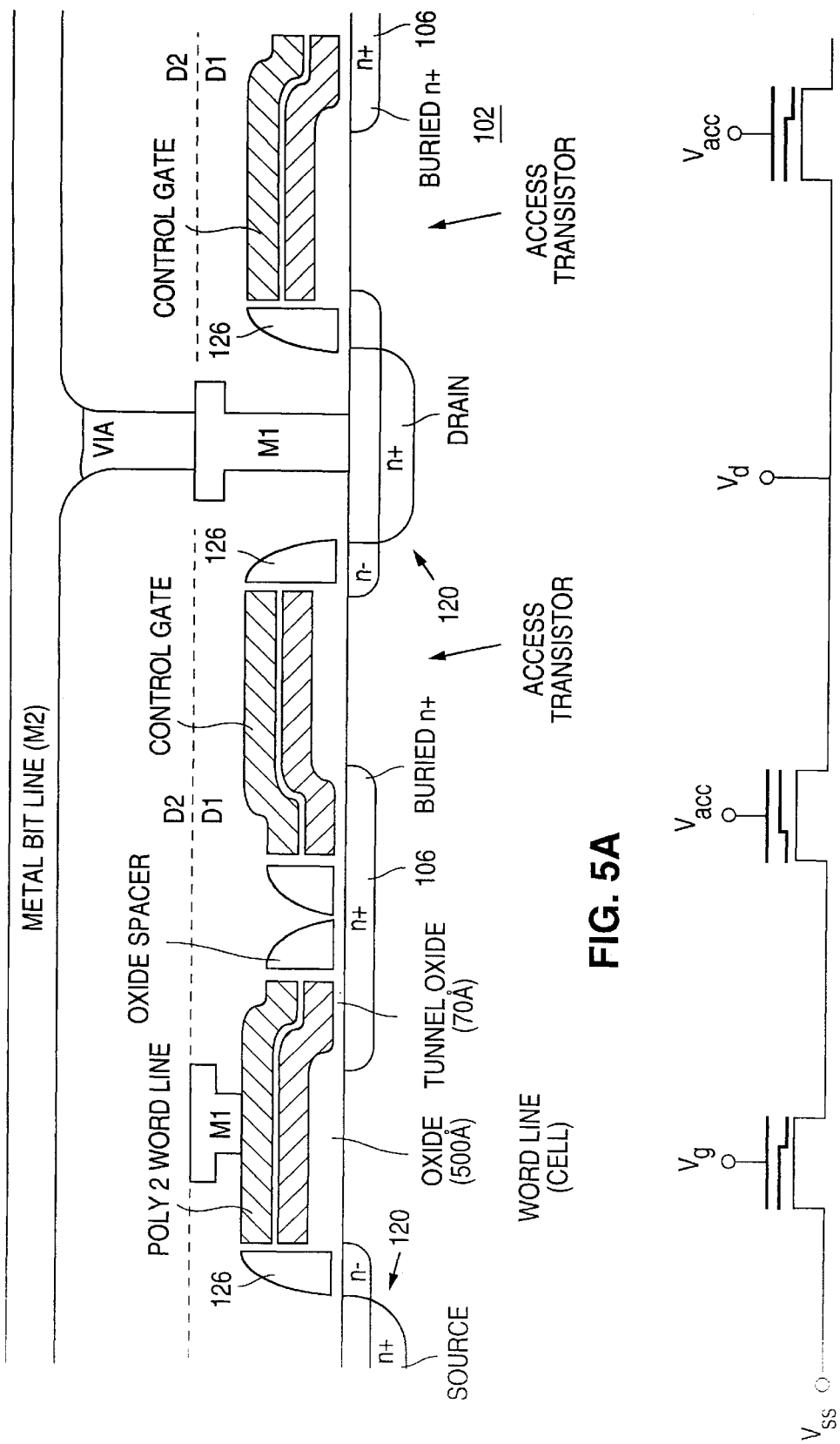

METHOD OF FABRICATING A HIGH DENSITY EEPROM CELL

BACKGROUND OF THE INVENTION

1. Field of the Invention

The present invention relates to high density electrically-erasable, programmable read-only-memory (EEPROM) devices and, in particular, to a method of fabricating a high-density EEPROM cell having reduced read time.

2. Discussion of the Related Art

The basic, fundamental challenge in creating an electrically-erasable programmable read only memory (EEPROM) cell is to use a controllable and reproducible electrical effect which has enough nonlinearity so that the memory cell can be written or erased at one voltage in less than 1 ms and can be read at another voltage, without any change in the programmed data for more than 10 years. Fowler-Nordheim tunneling exhibits the required nonlinearity and has been widely used in the operation of EEPROM memories.

In silicon (Si), the energy difference between the conduction band and the valence band is 1.1 eV. In silicon dioxide ($SiO_2$), the energy difference between these bands is about 8.1 Ev, with the conduction band in $SiO_2$ 3.2 Ev above that in Si. Since electron energy is about 0.025 Ev at thermal room temperature, the probability that an electron in Si can gain enough thermal energy to surmount the Si-to-$SiO_2$ barrier and enter the conduction band in $SiO_2$ is very small. If electrons are placed on a polysilicon floating gate surrounded by $SiO_2$, then this band diagram will by itself insure the retention of data.

Fowler-Nordheim emission, which was observed early in this century for the case of electron emission from metals into vacuums, was also observed by Lenzliger and Snow in 1969 for electron emission from silicon to silicon dioxide. In the presence of a high electric field at the Si–$SiO_2$ interface, the energy bands will be distorted and there is a small, but finite, probability that an electron in the conduction band of the Si will quantum mechanically tunnel through the energy barrier and emerge in the conduction band of the $SiO_2$.

The tunneling current increases exponentially with the applied field in accordance with the following general current density expression:

$$J=(AE2)\exp(-B/E)$$

where A and B are constants, and
E is the field at the Si–$SiO_2$ interface

This current is observable at a current density of 10 E–6 A/cm2 when the field at the Si–$SiO_2$ interface is about 10 MV/cm. Local fields of this magnitude, at voltages practicable for use in microelectronics, can be obtained by applying a voltage across either a thin (about 100 Å) oxide grown on bulk silicon or across thicker (about 500 Å) oxide grown on polysilicon. In the latter case, the field enhancement arises from textured polysilicon formation, i.e. positive curvature regions at the polysilicon-polysilicon oxide interface resulting in tunneling enhancement at similar voltages as in the first case.

The theoretically ideal EEPROM memory cell comprises a single transistor addressable by applying electrical signals to a specified row and a specified column of the memory array matrix. For example, to write a logic "1" or a logic "0" into this "ideal" cell, a voltage is applied to the control gate corresponding to the row (word line) of the selected cell while a voltage corresponding to either a "1" or a "0" is applied to the source or drain corresponding to the column (bit line) of the selected cell.

An important problem encountered in attempts to realize this "ideal" cell is the need for an additional access transistor in each memory cell to enable selection of a single row of memory cells while changing data in the selected cell without accidentally writing or erasing data stored in other rows. Unfortunately, the presence of an additional access transistor in each memory cell increases the size of the cell and leads to impractical die size for high density, megabit memory arrays.

It is, therefore, a goal to provide an EEPROM cell which does not require an additional distinct access transistor in each memory cell to provide reliable selection of a single cell for changing data while precluding accidental simultaneous programming or erasure in non-selected cells.

FIG. 1A shows a cross-section of the well-known FLOTOX EEPROM memory cell. In the FLOTOX cell, the tunnel oxide, which typically is less than 100 Å thick, is grown over an area defined photolithographically in the drain region (or an extension of the drain region, called buried n+). Charging of the floating gate to program the cell is achieved by grounding the source and the drain and applying a high voltage to the control gate. The FLOTOX cell is designed such that a large fraction of the applied voltage is coupled across the tunnel oxide, resulting in the transport of electrons from the drain to floating gate. Discharge of the floating gate to erase the cell is achieved by grounding the control gate, floating the source and applying a high voltage to the drain. In this case, most of the applied voltage is coupled across the tunnel oxide, but the field is reversed, resulting in tunneling of electrons from the floating gate to the drain. The source is floated so that there is no continuous current path, an important factor when an internal charge pump is used to generate the high voltage from a $\leq 5$ V supply.

If a single transistor memory cell is placed in a typical array with drains connected to metal columns and gates connected to common polysilicon word lines, the erasing of the cell, with the word line grounded, will mean that high voltage is applied to all drains in a common column. Erasing can be inhibited in non-selected cells by taking unselected word lines to a high voltage. However, this means that unselected cells along the same word line may be programmed. To avoid such disturb conditions, as shown in FIG. 1A, the FLOTOX cell utilizes a distinct access transistor to isolate the drain from the column bit line. The access transistor is off for rows that are not selected for erasure.

FIG. 1B shows a layout of the FIG. 1A FLOTOX cell, with the FIG. 1A cross-section being taken perpendicular to the word line (control gate) and through the tunnel oxide window.

FIGS. 2A–2G illustrate a process flow sequence utilized for fabricating the FIG. 1A FLOTOX cell. As shown in FIG. 2A, the fabrication sequence begins with the formation of an oxide layer 10 on a silicon substrate 12, followed by the patterning of a photoresist mask 14 and an ion implant step to form the buried n+ regions 16 of the EEPROM memory cell.

As shown in FIG. 2B, following the formation of the buried n+ regions 16, a tunnel window opening 18 is etched in the oxide layer 10 utilizing a second photoresist mask 20. A thin layer of tunnel oxide 22, approximately 80 Å thick, is then grown in the tunnel window, as shown in FIG. 2C.

Referring to FIG. 2D, following growth of the tunnel oxide 22, a first layer of polysilicon is deposited and doped to a desired conductivity. This is followed by formation of an oxide/nitride/oxide (ONO) layer over the first polysilicon layer. The ONO and underlying first polysilicon layer are then masked and etched to define the polysilicon floating gate 24 of the memory cell with an overlying ONO layer 26. Reoxidation and etchback results in the formation of oxide sidewall spacers 28 on the edges of the floating gate 24 and ONO 26.

Referring to FIG. 2E, a second layer of polysilicon is then deposited and doped to a desired concentration and then etched to define a control gate 30 of the memory cell and the gate 32 of the access transistor of the FLOTOX cell. An N+ source/drain/implant is then performed to further define the memory cell and the source/drain regions 34 of the access transistor, as shown in FIG. 2F.

Finally, a layer of dielectric material 36 is formed and planarized and then etched to form a contact opening to the N+ drain/bit line 34. This is followed by formation of a metal bit line structure 38, resulting in the FLOTOX cell shown in FIG. 2G (which is identical with the FIG. 1A cell).

The FLOTOX cell suffers from a number of disadvantages. First, it is susceptible to misalignment between the tunnel window and the buried N+ region of the memory cell. The second layer of polysilicon is used to form the word line of the memory cell and the access transistor gate. However, there is no poly 1/poly 2 self-aligned etch to allow definition of the poly 1 and poly 2 gates of the memory cell transistor. Furthermore, the cell is susceptible to misalignment between the poly 2 access transistor gate and the poly 1 floating gate of the memory cell.

E. K. Shelton, "Low-power EE-PROM can be reprogrammed fast", Electronics, Jul. 31, 1980, pp 89–92, discloses a basic EEPROM concept similar to the above-described FLOTOX concept. However, as shown in FIG. 3, instead of a tunnel oxide area defined lithographically over the drain (buried N+), the Shelton cell has its tunnelling area defined in the channel under the polysilicon floating gate. The polysilicon floating gate partially spans the drain side of the channel, while the remainder of the channel (source side) is spanned by an overlying aluminum control gate. The aluminum control gate is insulated from the polysilicon floating gate by a thin silicon nitride layer.

Furthermore, the Shelton memory cell is formed in a P-well on a N-substrate. Controlling the P-well potential allows the elimination of the distinct access transistor in each memory cell. The potential of the P-well and the sources and drains of the unselected cells are chosen during programming operations to prevent minority carriers from discharging any of the floating gates to the substrate while permitting an individual selected floating gate to be programmed.

Programming of the FIG. 3 cell is achieved by grounding the P-well and connecting the drain through a load resistance to the programming voltage. The AT source is connected to either the programming voltage or to ground depending upon whether a "1" or a "0" is to be stored. To initiate programming, the aluminum control gate is connected to the high voltage. If the source potential is also connected to the high voltage, then the internal access transistor doesn't turn on and the surface of the P-well below the floating gate is depleted of electrons. Only a small potential difference exists between the surface of the P-well and the floating gate. Therefore, no electrons tunnel into the gate and the cell remains in a 0 state. If the source terminal is connected to ground (to program a 1), then the internal access transistor turns on, the surface potential under the floating gate drops to close to 0 V, and electrons from the inversion layer tunnel through the thin oxide into the floating gate.

The FIG. 3 cell is erased by grounding the control gate and then raising the P-well to the programming voltage. This causes electrons to tunnel from the floating gate to the P-well via the tunnel oxide. As electrons tunnel through the tunnel oxide, the floating gate acquires a net positive charge.

Although the FIG. 3 Shelton cell differs from the FIG. 1 FLOTOX cell in that it does not utilize a distinct access transistor, it does require an internal access transistor and, thus, also requires a relatively large cell size.

Commonly-assigned U.S. Pat. No. 5,379,253, issued Jan. 3, 1995, to Albert Bergemont, discloses a memory cell wherein neither a distinct access transistor (as in the FLOTOX cell) nor an internal access transistor (as in the Shelton cell) is required to isolate a memory cell, which has been selected to be programmed, from an adjacent memory cell, which has not been selected to be programmed. As a result, the die size of a high-density EEPROM array constructed from the memory cells described in the '253 patent is smaller than the die size of an EEPROM array constructed from either the FLOTOX cell or the Shelton cell.

As is well known, the time required to read a memory cell can be a significant factor in the selection of an EEPROM device. Although the memory cell described in the '253 patent eliminates the need for a distinct access transistor and an internal access transistor, the time required to read a cell, regardless of the cell type utilized to construct the array, remains substantially the same. Thus, there is a need for an EEPROM array that significantly reduces the time required to read a cell of the array.

SUMMARY OF THE INVENTION

The present invention provides a high density EEPROM cell array structure that utilizes a floating gate architecture for the access transistor and a double poly process in which the control gate and floating gate of both the access transistor and the memory cell are self-aligned. Thus, the present invention provides a much more compact cell than previously available. In addition, the process flow utilizes only two masks compared to the four mask flow utilized in the prior art. This leads to cost reduction in the fabrication process. The structure results in significantly reduced read time for the cell array.

Thus, the present invention provides a method of fabricating an EEPROM cell structure in a semiconductor substrate. In accordance with the method, a layer of silicon oxide having a first thickness is formed on the silicon substrate. N-type dopant is then introduced into the semiconductor substrate to define a buried region beneath the silicon oxide layer. Next, a tunnel window opening is formed in the silicon oxide layer to expose a surface area of the buried region. A layer of tunnel oxide is then grown in the tunnel window opening on the exposed surface of the buried region, such that the tunnel oxide has a thickness that is less than the thickness of the silicon oxide. A first layer of polysilicon is then formed on the structure resulting from the foregoing steps, followed by an overlaying layer of oxide\nitride\oxide (ONO) and an overlying layer of second polysilicon. The poly-2, ONO\poly-1 sandwich is then anisotropically etched to form first and second stacks which provide the floating gate/control gate electrodes for the EEPROM cell access transistor and the EEPROM cell storage cell structure, respectively.

A better understanding of the features and advantages of the present invention will be obtained by reference to the following detailed description and accompanying drawings which set forth an illustrative embodiment in which the principles of the invention are utilized.

DESCRIPTION OF THE DRAWINGS

FIG. 5A is a cross-section drawing illustrating an EEPROM cell structure in accordance with the present invention.

FIG. 5B is a simple schematic diagram representative of the FIG. 5A structure.

DETAILED DESCRIPTION OF THE INVENTION

A process flow for fabricating an EEPROM cell structure in accordance with the concepts of the present invention will now be described in conjunction with the partial cross-sectional drawings provided in FIGS. 4A–4D. While specific process parameters are not provided, those skilled in the art will appreciate that the concepts of the invention are applicable regardless of these parameters, which will differ depending upon the specific memory cell structure under manufacture.

Figure 4A:
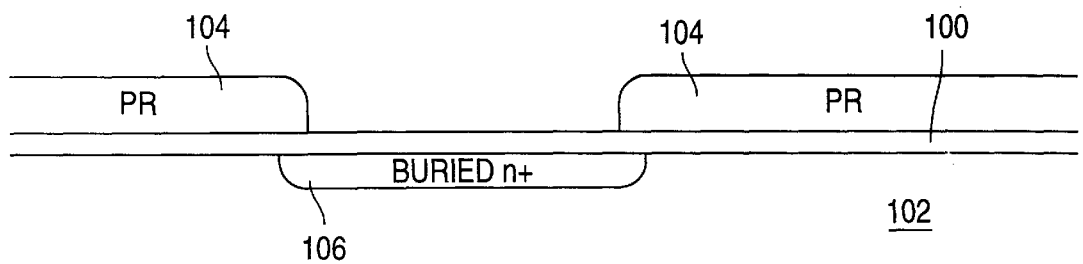
FIGS. 4A–4D are cross-section drawings illustrating a sequence of process steps for fabricating an EEPROM cell in accordance with the present invention.

Referring to FIG. 4A, the initial fabrication sequence in accordance with the present invention proceeds in the conventional manner with formation of n-well, p-well and field oxide. Then, an oxide layer 100 approximately 500 Å thick is formed on the silicon substrate 102. A layer of photoresist 104 is then formed on the oxide layer 100 and patterned to expose an underlying region of the substrate 102. An ion implantation step then introduces N-type dopant into the substrate to form a buried n+ region 106.

Figure 4B:
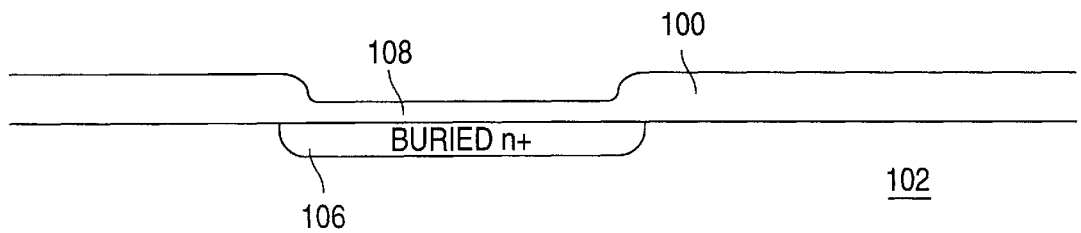

As shown in FIG. 4B, the oxide layer 100 is then masked and etched to form a tunnel oxide window over the buried n+ region 106. An implant is then performed for adjusting cell $V_T$. A thermal step then results in the growth of tunnel oxide 108 about 70 Å thick in the tunnel oxide window.

Figure 4C:
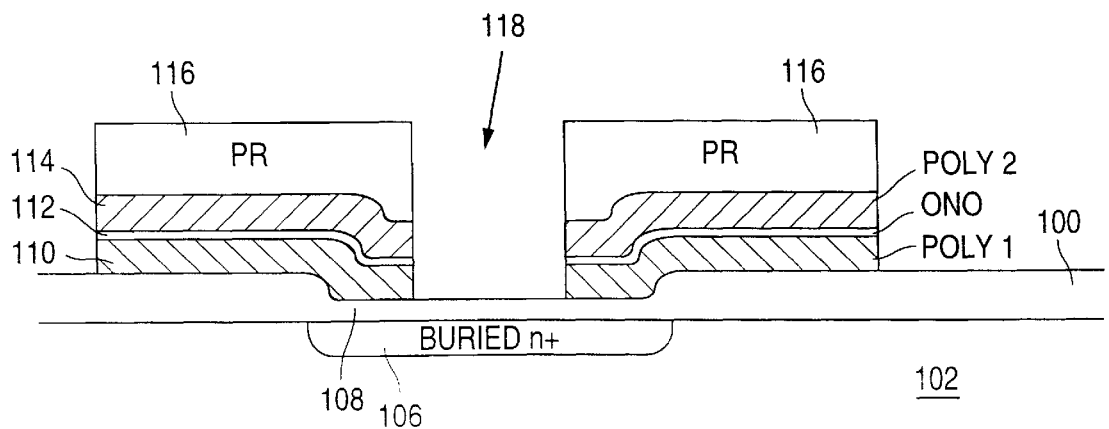

After formation of the tunnel oxide 108, a first layer 110 of polysilicon is formed on the oxide 100 and on the tunnel oxide 108. A layer 112 of dielectric material, typically oxide/nitride/oxide (ONO), is then formed over the first polysilicon layer 110. A second polysilicon layer 114 is then deposited on the ONO 112. The structure is then covered with a photoresist mask 116 which is patterned to expose the poly2/ONO/poly1 sandwich over the buried n+ region 106. The poly2/ONO/poly1 stack is then etched to provide an opening 118 over the buried N+ region 106 as shown in FIG. 4C.

Figure 4D:
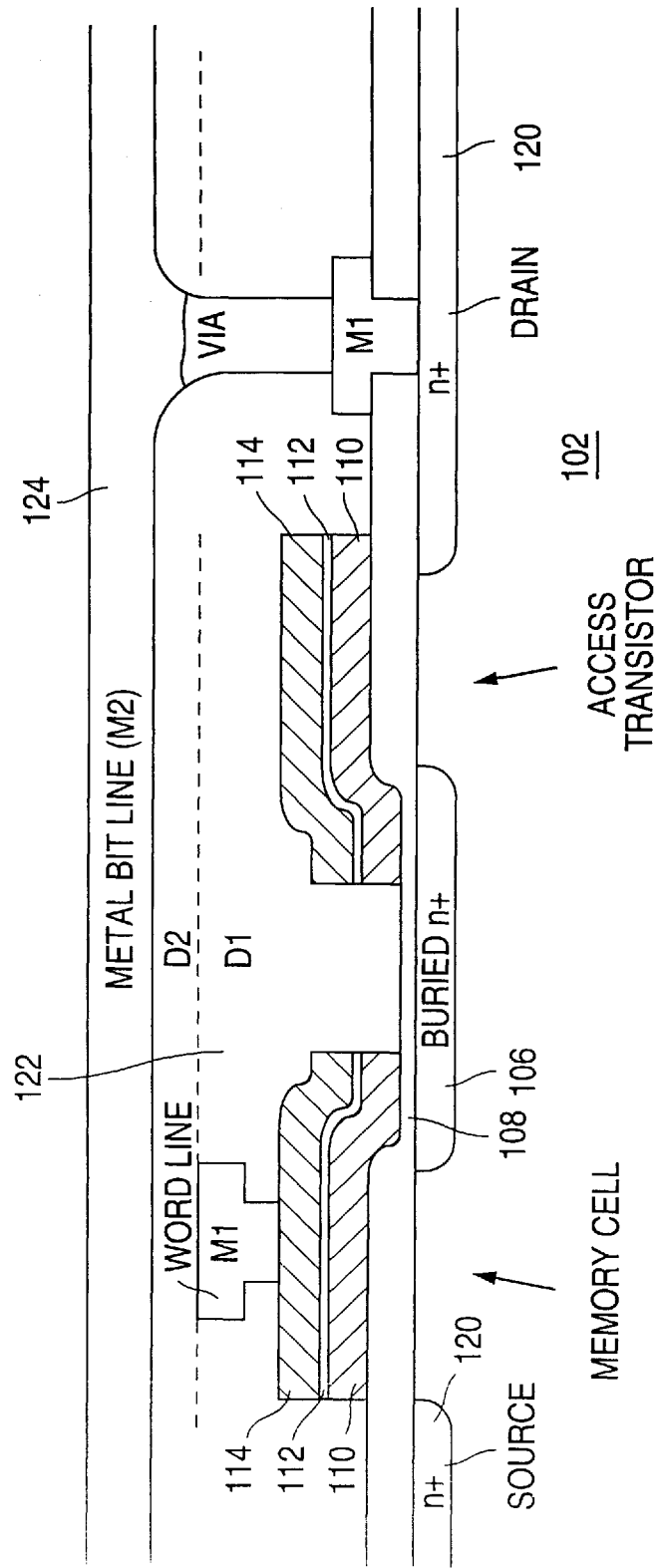

The resulting poly2/ONO/poly1 stack is then utilized for a further N-type dopant ion implantation step which provides the N+ source and drain regions 120 of the memory cell structure. This is followed by formation of a dielectric layer 122, the formation of contact openings in the dielectric layer to the N+ drain regions and contact openings on top of the poly2 of each cell. A first layer of metal (M1) wordline is formed to contact the control gate of each cell. A second layer of metal (M2) is used for the bit line to provide contact to N+ drain regions via a metal plug and M1 contact, as illustrated in FIG. 4D.

The final device structure is shown in FIG. 5A. FIG. 5A shows that oxide spacers 126 are formed at the edges of the poly2/ONO/poly1 stacks to facilitate the self-aligned implantation of N-type dopant into the source/drain regions to form the final N+ source/drain junctions. Thus, the resulting EEPROM cell structure and islands of poly2/ONO/poly1 stacks, in accordance with the invention, includes a memory cell transistor in which the floating gate of the storage transistor is self aligned to the overlying poly2 control gate and, significantly, the access transistor is also a floating gate structure in which the floating gate is self-aligned to the overlying control gate.

FIG. 5B provides a schematic illustration of the FIG. 5A memory cell structure. Note that adjacent memory cells in the array are a mirror image of one another around the N+ drain contact ($V_d$)

Figure 1A:
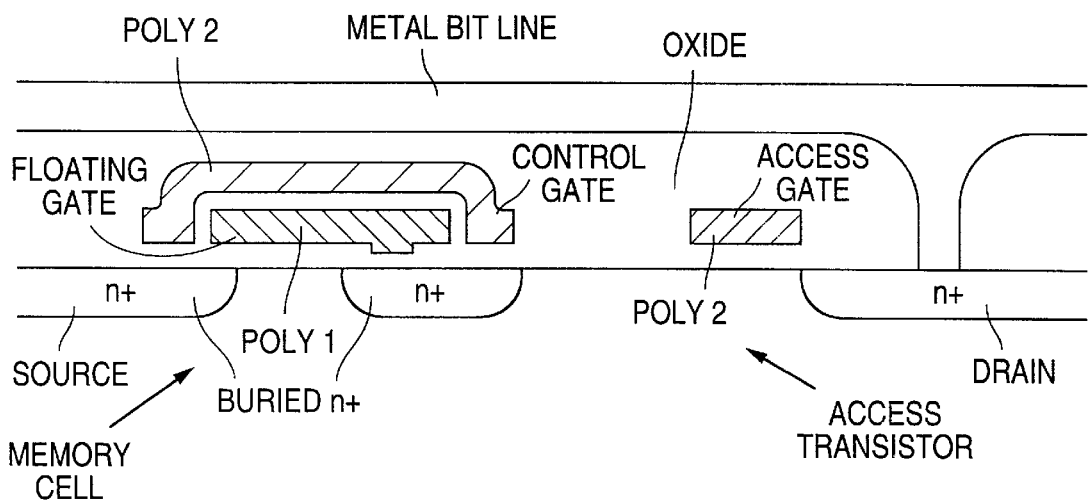
FIG. 1A is a cross-section drawing illustrating a conventional FLOTOX EEPROM cell architecture.
Figure 1B:
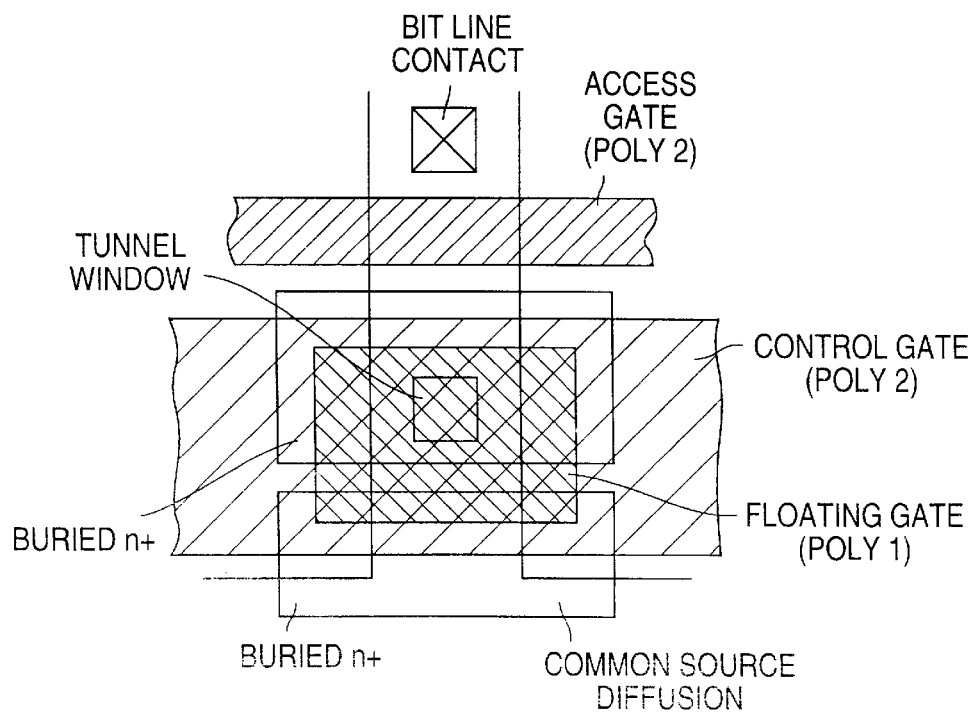
FIG. 1B is a layout drawing of the FIG. 1A FLOTOX cell.
Figure 2A:
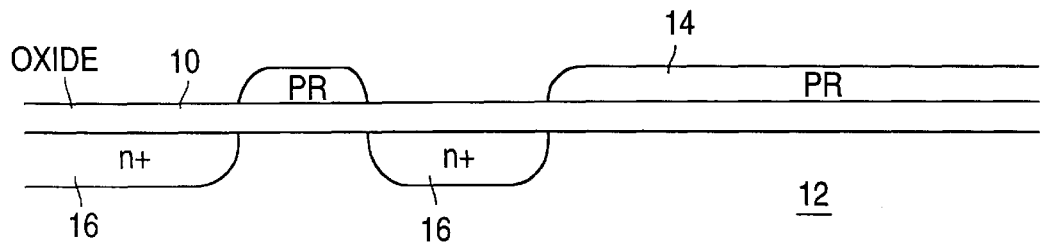
FIGS. 2A–2G are cross-section drawings illustrating a sequence of steps for fabricating the FIG. 1A FLOTOX cell.
Figure 2B:
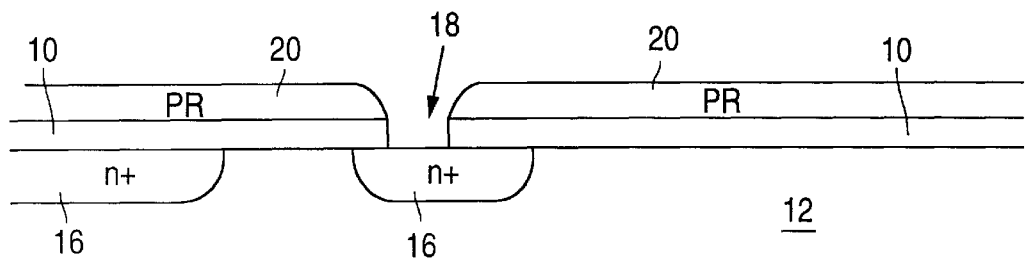
Figure 2C:
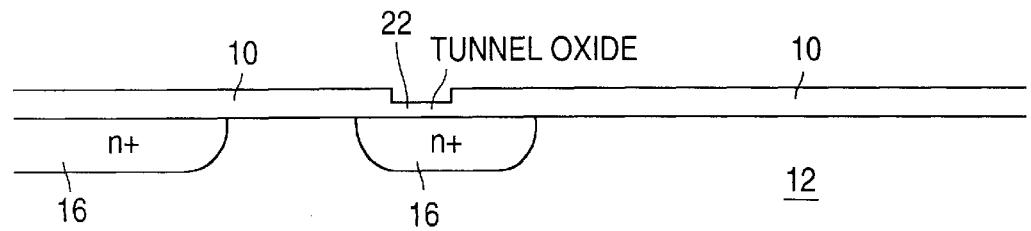
Figure 2D:
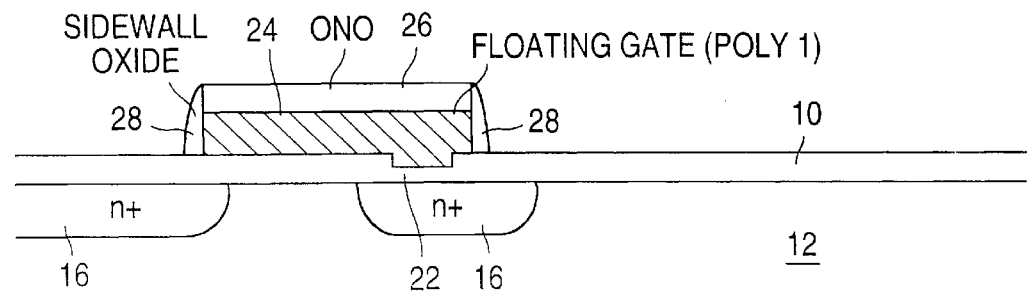
Figure 2E:
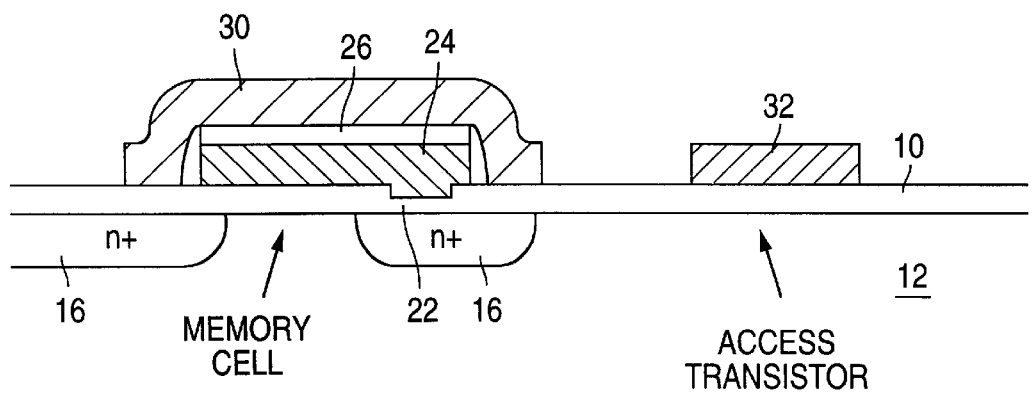
Figure 2F:
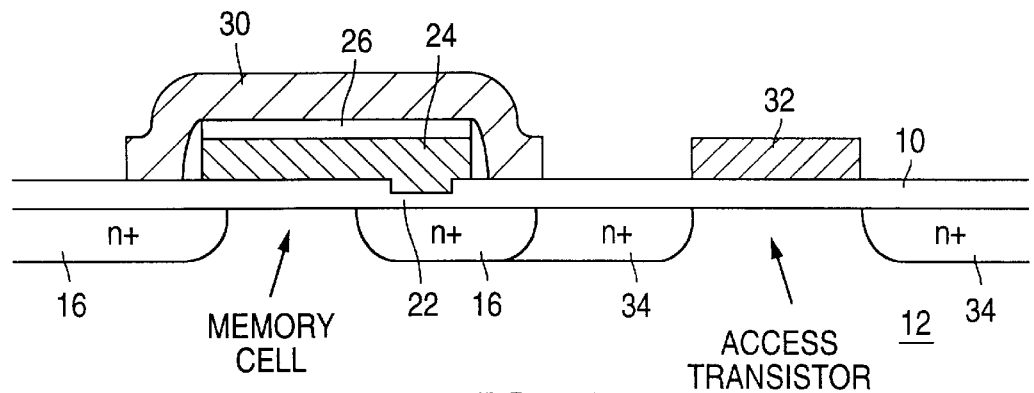
Figure 2G:
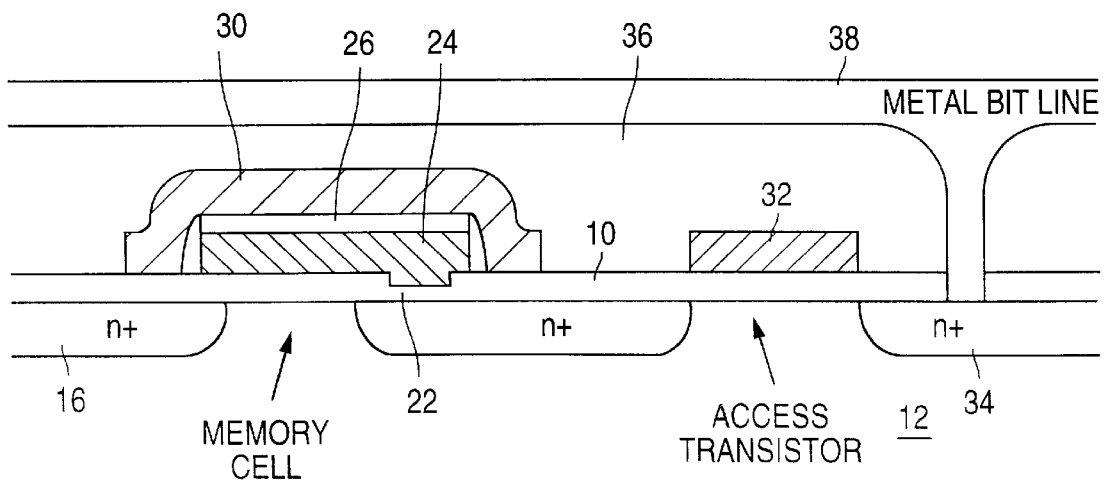
Figure 3:
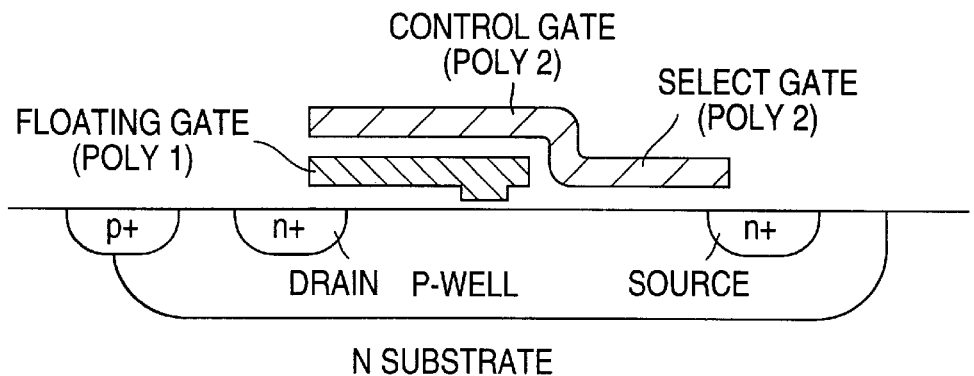
FIG. 3 is a cross-section drawing showing a prior art EEPROM cell that utilizes an internal access transistor.
Figure 6:
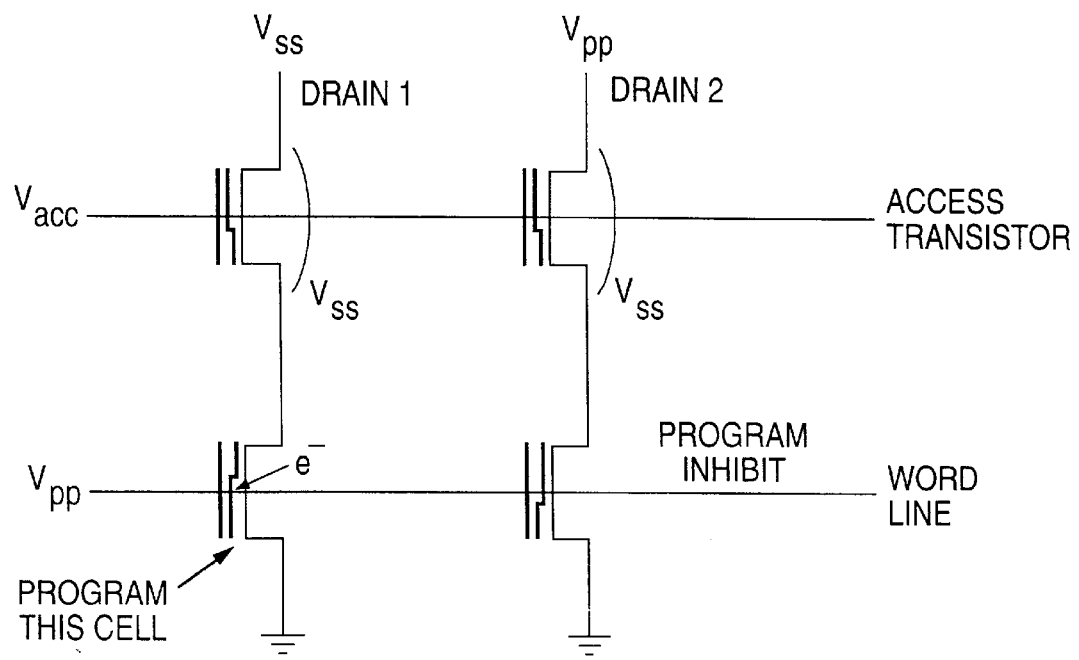
FIG. 6 is a schematic diagram illustrating the programming of a EEPROM cell in accordance with the present invention.

FIG. 6 shows a method of programming all of the memory cells on a page or, alternatively, in a byte. As shown in FIG. 6, to program the cells along a selected wordline, a programming voltage $V_{pp}$ is applied to the control gate of the cells connected to that wordline. The drains of all columns of the array are held at a supply voltage $V_{ss}$. The access transistor of the cells to be programmed is held at an access voltage $V_{acc}$ which is large enough to switch the access transistors, thereby passing the supply voltage to the drain of the cell to be programmed, thereby facilitating hot electron injection to the floating gate of the cell. The programming voltage $V_{pp}$ is large enough to inject hot electrons onto the floating gates. For example, in a typical 0.35 micron technology, $V_{acc}=5$ V and $V_{pp}=9$ V.

Figure 7:
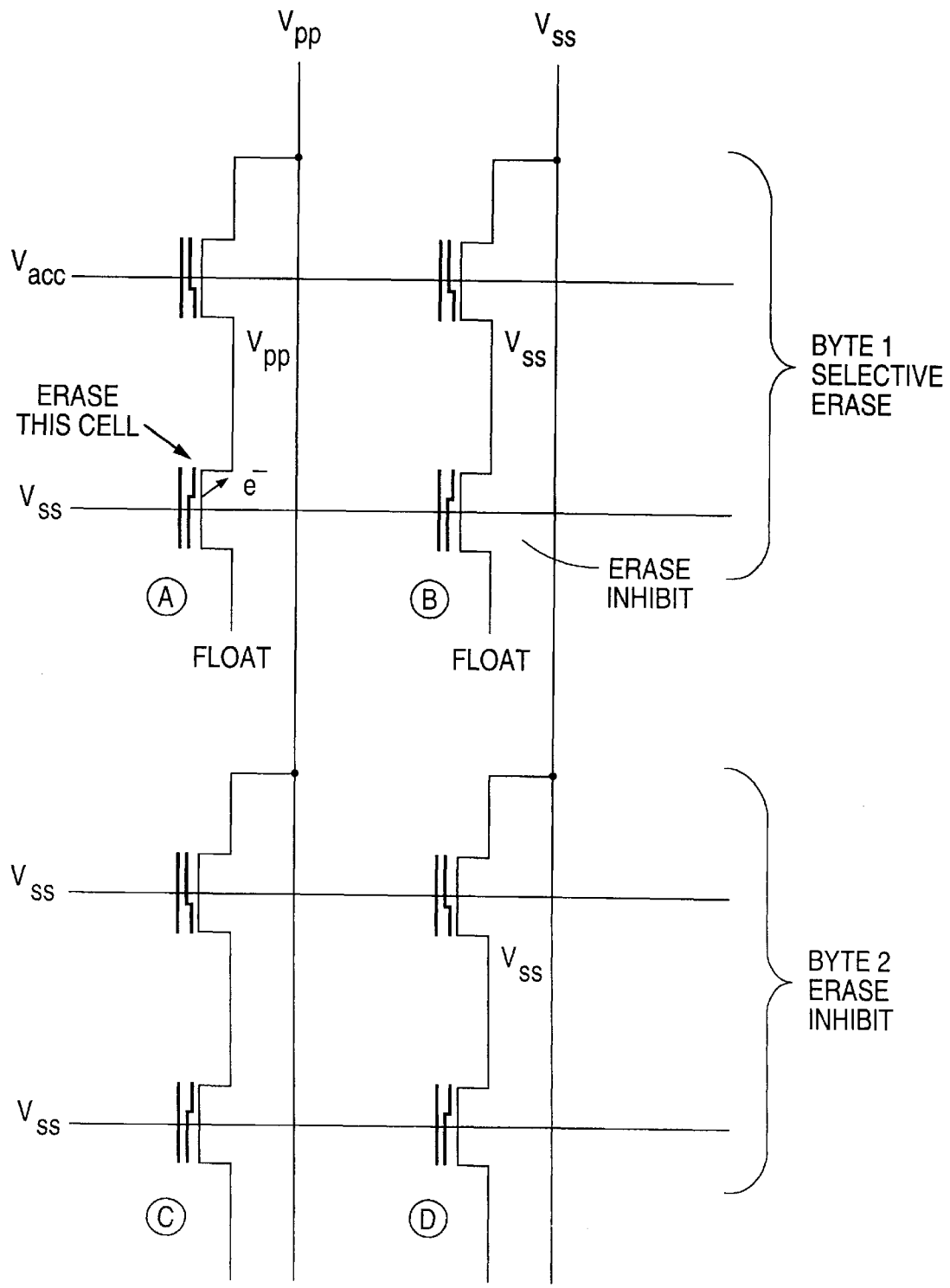
FIG. 7. is a schematic diagram illustrating the erasure of an EEPROM cell in accordance with the present invention.

FIG. 7 shows the selective erasure of a cell in an EPROM memory array constructed utilizing cells in accordance with the present invention. To erase cell A, the programming voltage $V_{pp}$ is connected to the buried N+ drain of the transistors in the column to which cell A is connected. An access voltage $V_{acc}$, which is large enough to pass $V_{pp}$ through the access transistor, is applied to the control gate of the access transistor for cell A. The gate of cell A is held at the supply voltage $V_{SS}$. Thus, electrons are removed from the floating gate of cell A to its drain through Fowler-Nordheim tunneling. The cells in bytes in which erase is to be inhibited have their control gates held at the supply voltage $V_{SS}$, as shown in FIG. 7. Again, typical voltages for a 0.35 micron technology would be $V_{acc}=5$ V and $V_{pp}=9$ V.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of fabricating and EEPROM cell structure in a semiconductor substrate, the method comprising:

forming a layer of silicon oxide having a first thickness on the silicon substrate;

introducing N-type dopant into the semiconductor substrate to define a buried region beneath the silicon oxide layer;

forming a tunnel window opening in the silicon oxide layer to expose a surface area of the buried region;

forming a layer of tunnel oxide in the tunnel window opening on the exposed surface area of the buried region, the tunnel oxide having a second thickness that is less than the first thickness;

forming a first layer of polysilicon over the structure resulting from the foregoing steps;

forming a layer of dielectric material on the first polysilicon layer;

forming a second layer of polysilicon on the layer of dielectric material, the second layer of polysilicon, the layer of dielectric material and the first polysilicon layer defining a poly-2/dielectric\poly-1 sandwich;

anisotropically etching the poly-2\dielectric\poly-1 sandwich to define first and second spaced-apart poly-2\dielectric\poly-1 stacks;

utilizing the first and second poly2\dielectric\poly-1 stacks in a self-aligned ion implantation step to define a drain\bit line region of N-type conductivity formed in the semiconductor substrate and in spaced-apart relationship to the buried region to define an access transistor substrate channel region therebetween, and to define a source region of N-type conductivity formed in the semiconductor substrate and in spaced-apart relationship to the buried region to define the storage cell substrate channel region therebetween;

wherein the first poly-2\dielectric\poly-1 stack includes a poly-1 access transistor floating gate having a first portion formed over the axis transistor substrate channel region and separated therefrom by silicon oxide having the first thickness and having a second portion formed over a first portion of the buried region and separated therefrom by tunnel oxide and a poly-2 access transistor control gate formed over the access transistor floating gate and separated therefrom by dielectric material; and wherein the second poly-2/dielectric\poly-1 stack includes a poly-1 storage cell floating gate having a first portion formed over the storage cell channel region and separated therefrom by silicon oxide having the first thickness and having a second portion formed over a second portion of the buried region and separated therefrom by tunnel oxide and a poly-2 storage cell control gate formed over the storage cell floating gate and separated therefrom by dielectric material.

2. A method as in claim 1 and wherein the first thickness is about 500 Å.

3. A method as in claim 1 and wherein the second thickness is about 70 Å.

4. A method as in claim 1 and wherein the dielectric material is oxide\nitride\oxide (ONO).

* * * * *

UNITED STATES PATENT AND TRADEMARK OFFICE
CERTIFICATE OF CORRECTION

PATENT NO.: 5,856,222
DATED: January 5, 1999
INVENTOR(S): Albert Bergemont et al.

It is certified that errors appear in the above-identified patent and that said Letters Patent is hereby corrected as shown below:

In Col. 6, line 57, delete "and" and replace with --an--.

In Col. 7, line 15, delete "poly2" and replace with --poly-2--.

Signed and Sealed this

Sixth Day of April, 1999

Q. TODD DICKINSON

*Attest:*

*Attesting Officer*  *Acting Commissioner of Patents and Trademarks*